(12) United States Patent
Tan et al.

(10) Patent No.: US 8,189,362 B2
(45) Date of Patent: May 29, 2012

(54) DATA ENCODING SCHEME TO REDUCE SENSE CURRENT

(75) Inventors: Jun Pin Tan, Kuala Lumpur (MY); Tze Swan Tan, Pahang (MY); Chuan Khye Chai, Penang (MY); Boon Jin Ang, Penang (MY); Kar Keng Chua, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/151,230

(22) Filed: Jun. 1, 2011

(65) Prior Publication Data

US 2011/0292711 A1 Dec. 1, 2011

Related U.S. Application Data

(62) Division of application No. 12/212,801, filed on Sep. 18, 2008, now Pat. No. 7,978,493.

(51) Int. Cl.
*G11C 17/00* (2006.01)

(52) U.S. Cl. .......................................... 365/96; 365/227

(58) Field of Classification Search .................... 365/96, 365/227, 94, 189.08; 711/108, 158
See application file for complete search history.

(56) References Cited

U.S. PATENT DOCUMENTS 7,652,903 B2 * 1/2010 Huang .......................... 365/49.1

* cited by examiner

*Primary Examiner* — Vu Le
(74) *Attorney, Agent, or Firm* — Womble Carlyle Sandridge & Rice LLP

(57) ABSTRACT

Techniques for encoding and decoding fuse data to reduce sense current are disclosed. An embodiment to encode fuse sense data includes inverting each of the bits of the fuse data and using an individual fuse as a flag bit to record the data inversion. The states of the respective fuses may represent different logic states. A fuse may be blown to indicate a logic one and likewise, an unblown fuse may indicate a logic zero. A blown fuse and an unblown fuse may have different current consumption. An unblown fuse may consume more sensing current compared to a blown fuse. Another embodiment to decode the encoded fuse data includes embedded logic circuits and a separate fuse as a flag bit. Encoding and decoding fuse data may reduce fuse sensing current.

17 Claims, 8 Drawing Sheets

DATA ENCODING SCHEME TO REDUCE SENSE CURRENT

CROSS REFERENCE TO RELATED APPLICATIONS

This application is a divisional application of U.S. patent application Ser. No. 12/212,801 filed on Sep. 18, 2008 now U.S. Pat. No. 7,978,493. The disclosure of this related application is incorporated herein by reference for all purposes.

BACKGROUND

The present invention relates generally to one-time programmable non-volatile memory elements and more specifically to an encoding scheme to reduce sense current in a poly fuse array.

Fuses are usually one-time programmable (OTP) devices. In other words, fuses cannot be reprogrammed once they are programmed. Poly fuses, also a type of OTP non-volatile memory (NVM), are used in programmable devices as integrated circuits increasingly require embedded NVM. Fuse memory can be programmed to configure an integrated circuit, to store die information, program instructions, configuration information and other relevant information.

Data is stored based on the condition of the fuse. A fuse may have a low resistance state or a high resistance state. A programmed fuse may be blown to indicate a high resistance state. And similarly, a blown fuse may represent a logic one value while an unblown fuse may represent a logic zero value. Hence, the different states represent specific logical states at any one time in an array of fuses. Sensing circuits are used to sense the state of the fuses. Poly fuses have different sense currents depending on the state of the fuse at any one time. An unblown fuse, for instance, may require more sense current compared to a blown fuse. Therefore, the sense current is highly dependent on the number of blown and unblown fuses.

It is highly desirable to have a method that will reduce the fuse sensing current, thereby reducing the overall power bussing requirement in a poly fuse array. It is also advantageous to have a power-saving scheme that does not substantially increase die area of the array.

SUMMARY

Embodiments of the present invention include methods and apparatuses for reducing fuse sense current in a poly fuse array. It should be appreciated that the present invention can be implemented in numerous ways, such as a process, an apparatus, a system, a device or a method on a computer readable medium. Several inventive embodiments of the present invention are described below.

In one aspect of the invention, a method of manipulating fuse data to reduce sense current is provided. The method includes determining the number of fuses to be blown and the number of fuses to remain unblown in an array of fuses.

Then, the number of fuses to be blown and the number of fuses to remain unblown in the array of fuses are compared. An appropriate value is assigned to an individual bit. The value assigned to that bit is based on the result of the earlier comparison. For example, if the number of fuses to be blown is greater than the number of fuses to remain unblown, the bit may be assigned a '1' and vice versa. In one embodiment, all the bits in the array of fuses are inverted based on the number of fuses to be blown and fuses to remain unblown in the poly fuse array.

In another aspect of the present invention, an apparatus for decoding fuse data is disclosed. The apparatus has an array of fuses and one end or terminal of each of these fuses is coupled to a common power source. An array of amplifiers is coupled to the other end or terminal of each of the fuses. An array of logic circuits is positioned between the array of amplifiers and an array of registers. Each of these logic circuits is connected to the amplifiers and an input to each of the registers. A flag fuse is also coupled to an individual amplifier. The output of this individual amplifier is then coupled to an input to each of the logic circuits. In one embodiment, the output of the individual amplifier serves as a select bit for the logic circuits.

In another embodiment in accordance with the present invention, a system to encode fuse data to reduce fuse sense current is described. The system has a first counter counting the number of occurrences of a first value. The system also has a second counter counting the number of occurrences of a second value. Both the first counter and the second counter are coupled to a comparator. The output of the comparator is coupled to an input to an array of logic circuits. The array of logic circuits is positioned between an array of registers and an array of fuses.

In another aspect of the present invention, a machine-readable medium encoded with machine-readable instructions is described. The machine-readable medium has instructions to record the number of occurrences of a first value and the number of occurrences of a second value. The machine-readable medium also contains instructions to compare the number of occurrences of the first and second value, and invert each of the binary values based on the result of the comparison.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe methods and apparatuses for encoding and decoding fuse data in order to reduce fuse sensing current in a poly fuse array. It will be obvious, however, to one skilled in the art, that the present invention may be practiced without some or all of these specific details. In other instances, well-known operations have not been described in detail in order not to unnecessarily obscure the present invention.

Embodiments described herein provide techniques for encoding and decoding fuse data. A blown fuse and an unblown fuse in a poly fuse array have different power consumption. In an illustrative example, the sense current for a blown fuse is less than 0.15 mA while the sense current for an unblown fuse is more than 0.6 mA. Based on this example, the device consumes the most sense current in a worst case scenario when all the fuses remain unblown. Therefore, in one embodiment, the encoding scheme ensures that the number of unblown fuses (i.e. the number of 0s) stored is no greater than the number of blown fuses (i.e. the number of 1s). One of the embodiments described includes a method of encoding fuse data by inverting all the fuse bits and using a separate bit as a flag bit for the encoding scheme. The decoding method described, as one of the embodiments, decodes the encoded fuse data accordingly based on the value stored in the flag bit. The present invention reduces sense current by encoding fuse data to limit the number of unblown fuses. Reducing the sense current is desirable because the sense current determines the power bussing requirement of a poly fuse array and subsequently, the power requirement of an integrated circuit that utilizes a poly fuse array as an embedded non volatile memory (NVM). In other words, the power bussing requirement of a poly fuse array can be reduced by reducing the fuse sensing current. Additionally, by minimizing the current consumption, the present embodiments also help reduce Vcc sag and ground bounce in wire bond packaging.

Encoding fuse data by limiting the number of unblown fuses reduces fuse sensing current. The reduction in fuse sensing current minimizes the power bussing requirement of a poly fuse array. Vcc sag and ground bounce typically experienced in wire bond packaging are reduced when the current consumption is reduced. Minimizing the power bussing requirement also reduces metal congestion in the die. The size of a power bus is inversely proportional to the resistance of the bus.

For example, a wider power bus has a lower resistance. Following Ohm's law (V=IR), narrower power busses are possible when sense current is reduced. Therefore, reducing the sense current can also reduce metal congestion in the die.

Figure 1:
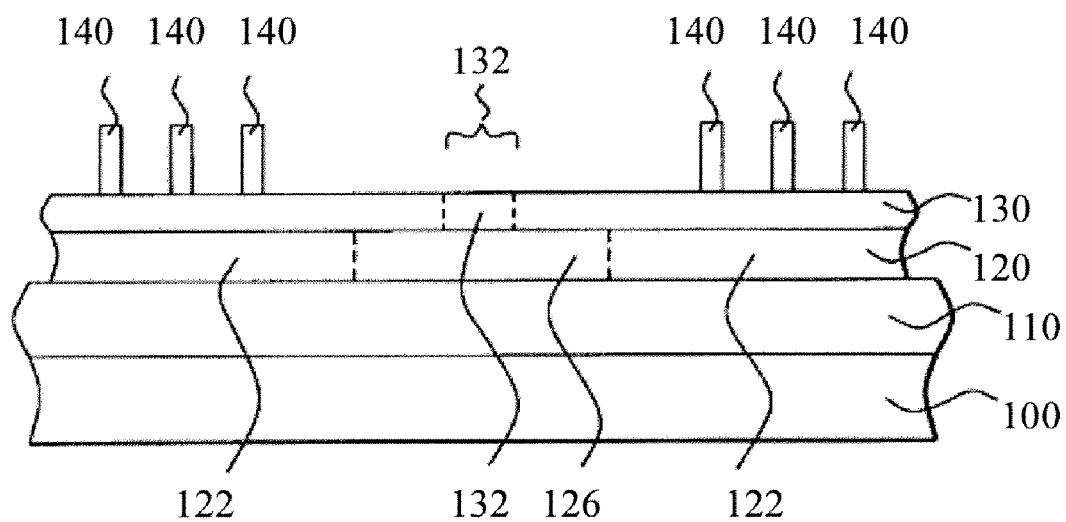
FIG. 1, meant to be exemplary and not limiting, shows a cross-section of a poly fuse used in an embodiment of the invention.

FIG. 1, meant to be exemplary and not limiting, shows a cross-section of a poly fuse. The poly fuse as shown in FIG. 1 has a substrate layer 100 and an optional oxide layer 110 on top of the substrate layer 100. A poly layer 120 is disposed on the optional oxide layer 110. The poly layer 120 has a doped area 122. One side of the doped area may be N+ doped and the other side of the doped area may be P+ doped. There is an undoped portion 126 between the doped sides. Once programmed, the undoped portion 126 provides an increased resistance. In one embodiment, the programmed resistance can be increased by increasing the spacing 126 between the doped sides 122. A silicide layer 130 is disposed on the poly layer 120. In one embodiment, the silicide layer 130 is composed of cobalt silicide ($CoSi_2$). However, this is meant to be exemplary and not limiting. In another embodiment, the silicide layer 130 is composed of titanium silicide (TiSi) or nickel silicide (NiSi). The contacts 140 are placed on both sides of the poly fuse. Fuse devices are programmed by generating a pulse of current through the fuse device. A discontinuity 132 forms on the silicide layer 130 after the poly fuse is programmed. This discontinuity 132 may be referred to as a silicide agglomeration area. It should be noted that the discontinuity 132 forms an electrical discontinuity so that the resistance of the fusible link can be selectively increased.

Figure 2:
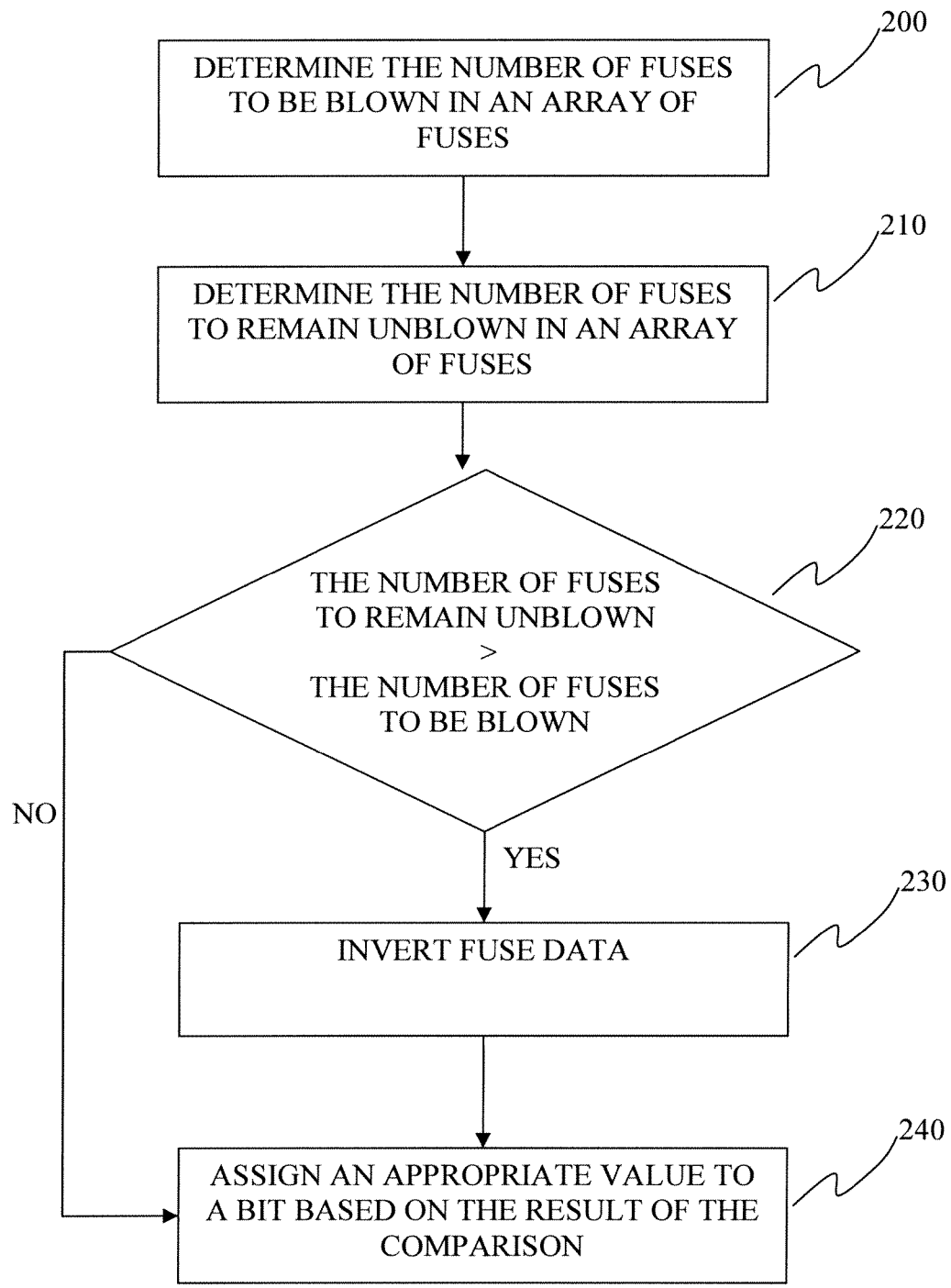
FIG. 2, meant to be illustrative and not limiting, depicts the steps for encoding fuse data in a poly fuse array used in an embodiment of the invention.

FIG. 2, meant to be illustrative and not restrictive, depicts the method operations for encoding fuse data in a poly fuse array. As shown in the simplified flow chart in FIG. 2, the number of fuses to be blown in an array of fuses is determined in operation 200. Then, the number of fuses to remain unblown in the same array of fuses is determined in operation 210. The number of fuses to be blown and the number of fuses to remain unblown are compared in operation 220. In an example embodiment, a blown fuse represents a logic one value and an unblown fuse represents a logic zero value. One skilled in the art should appreciate that an unblown fuse can represent logic one and likewise, a blown fuse can also represent logic zero. If the number of fuses to remain unblown is greater than the number of fuses to be blown, each bit of the fuse data is inverted in operation 230. A value is assigned to a flag bit based on the result of the comparison in operation 240. In an example embodiment, the bit is set to '1' if the data was inverted in operation 230. Otherwise, the bit is set to '0' if there was no inversion. However, this is meant to be exemplary and not limiting.

Figure 3:
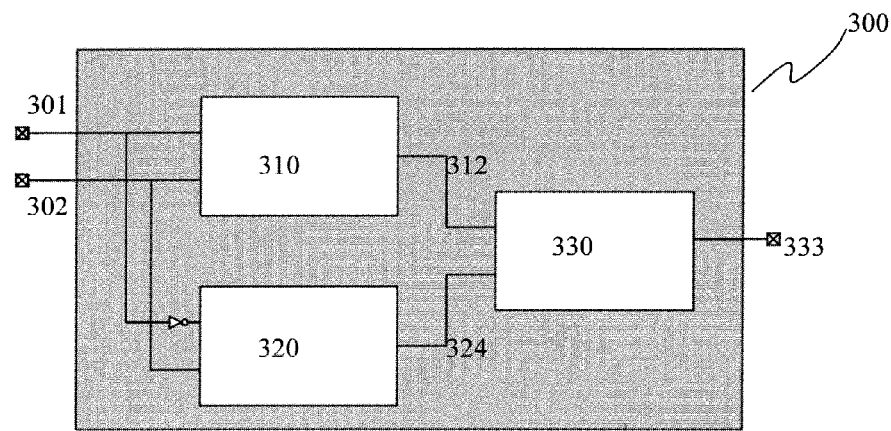
FIG. 3, meant to be illustrative and not restrictive, shows the flag bit generation block used in an embodiment of the invention.
Figure 3A:
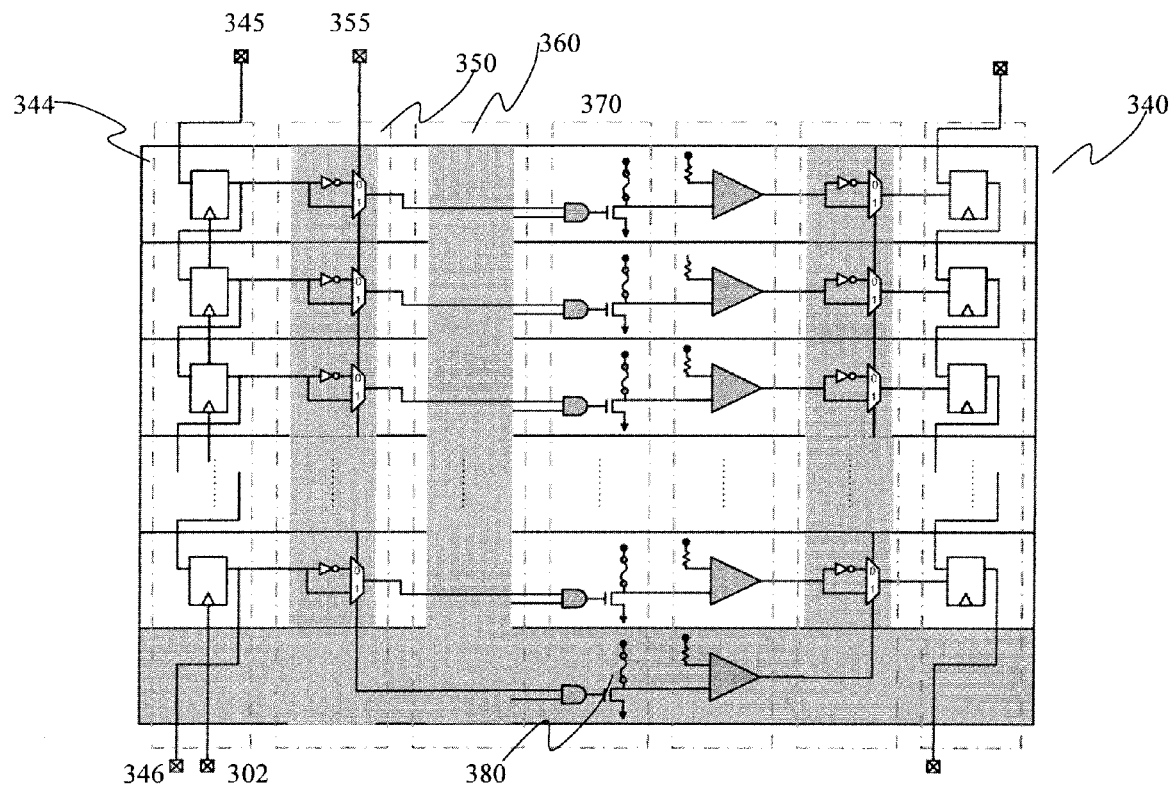
FIG. 3A, meant to be illustrative and not restrictive, shows a complete fuse frame with an encoding logic block used in an embodiment of the invention.

In one embodiment, the encoding scheme is implemented with a flag bit generation block coupled to an encoding logic block embedded in the fuse frame. FIGS. 3 and 3A show a hardware implementation of such an embodiment. FIG. 3, meant to be illustrative and not restrictive, shows the flag bit generation block 300. A first counter 310 receives an input from the input line 301 and counts the occurrences of a first value. A second counter 320 receives the same input and counts the occurrences of a second value. Both counters are also coupled to a clock input 302. The first counter 310 and the second counter 320 are binary counters in one embodiment. The first counter 310 counts the occurrences of logic "1" values while the second counter 320 counts the occurrences of logic "0" values. The number of occurrences of the first value from the first counter 310 is transmitted through an output line 312 to the comparator 330. Likewise, the number of occurrences of the second value from the second counter 320 is transmitted through an output line 324 to the comparator 330. Both the values from the first counter 310 and the second counter 320 are compared by the comparator 330. The output 333 of the comparator carries the result of the comparison.

The output 333 of the comparator is coupled to an input to an array of logic circuits 350 as shown in FIG. 3A. FIG. 3A, meant to be illustrative and not restrictive, shows the complete fuse frame 340 with an encoding logic block 350. The poly fuse array can be distributed in multiple fuse frames. For example, a 256-bit array can be divided into four 64-bit frames. One skilled in the art should appreciate that any number of fuse array frames may be used even though only one is shown in FIG. 3A. In one embodiment, the output of the last register 346 is coupled to the next frame. If the frame is the last frame, then the output 346 is coupled to the destination. In some embodiments, the destination is the JTAG (Joint Test Action Group) interface. Other destinations are within the scope of the invention.

An array of registers receives input data from the input 345. The array of registers 344 is coupled to the array of logic circuits 350. The array of logic circuits 350 receives the input from the registers 344. In FIG. 3A, the array of logic circuits is an array of 2-to-1 multiplexers with one select line 355. One of the inputs of each of the 2-to-1 multiplexers is inverted. The array of 2-to-1 multiplexers 350 is the encoding logic block. The select line 355 is coupled to the output of the comparator 333. The output 333 of the comparator thus acts as a select bit for the array of multiplexers 350. In one embodiment, if the output 312 of the first counter 310 is greater than or equal to the output 322 of the second counter 320, the output 333 of the comparator is a '1'. One skilled in the art should appreciate that the comparator can output a '0' instead of a '1' if desired. The input is therefore inverted or encoded by the logic circuits 350 based on the result of the comparison 333.

The select line 355 is coupled to a fuse 380. This fuse acts as a flag bit. In some embodiments, the fuse 380 is blown when the output 333 of the comparator is a '1'. In other embodiments, the fuse 380 is blown when the output 333 of the comparator is a '0'. Each fuse bit is selectively inverted in the decoding process based on the condition of the fuse 380. As shown in FIG. 3A, the output of each of the logic circuits 350 is coupled to an array of poly fuses 370. Each of the poly fuses in the array of poly fuses 370 is coupled to a transistor and an AND gate. The first input of each of the AND gate in the array of poly fuses 370 is coupled to the output of the logic circuits 350. The second input of each of the AND gate in the array of poly fuses 370 is coupled to a blow decoder in the array of blow decoder circuits 360. The array of blow decoder circuits 360 is shown as a block 360 and complex circuit elements are left out in order not to obscure the present invention.

Each of the blow decoders in the array 360 generates a signal to turn on the transistors in the array of poly fuses 370. In some embodiments, each blow decoder in the array 360 turns on the transistors in the array of poly fuses 370 by driving a logic one value to each of the corresponding AND gates in the array of poly fuses 370 sequentially. The rest of the fuse frame 340 shows the decoding logic, details of which will be described in later paragraphs.

Figure 3B:
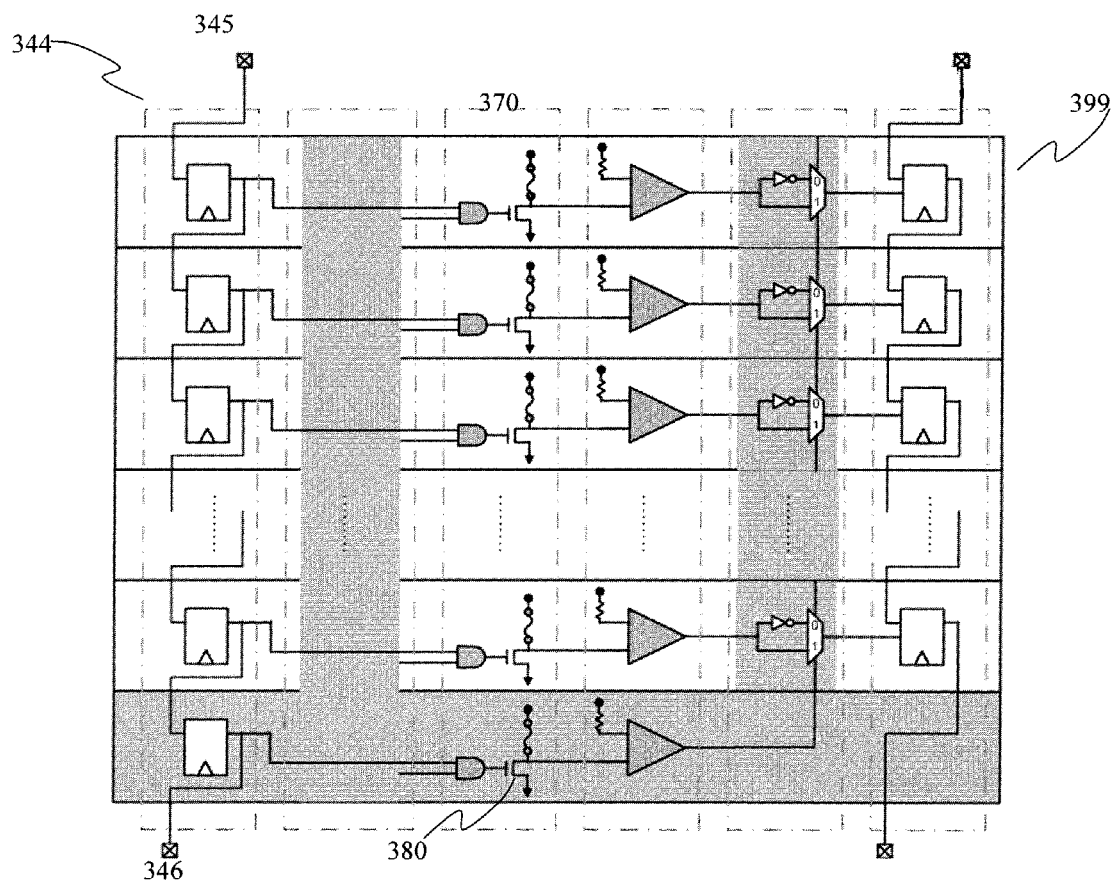
FIG. 3B, meant to be illustrative and not restrictive, shows the fuse frame without the encoding logic as an example embodiment.

In other embodiments, the encoding logic can be implemented with a software tool. The software tool will produce an output file based on the encoding scheme described in FIG. 2. This file can then be used to program the fuse frame based on the same encoding scheme. Therefore, in some of these embodiments, the encoding logic 350 does not have to be embedded in the fuse frame 340. FIG. 3B, shows some the embodiments of the fuse frame 399 without the encoding logic 350.

Figure 4:
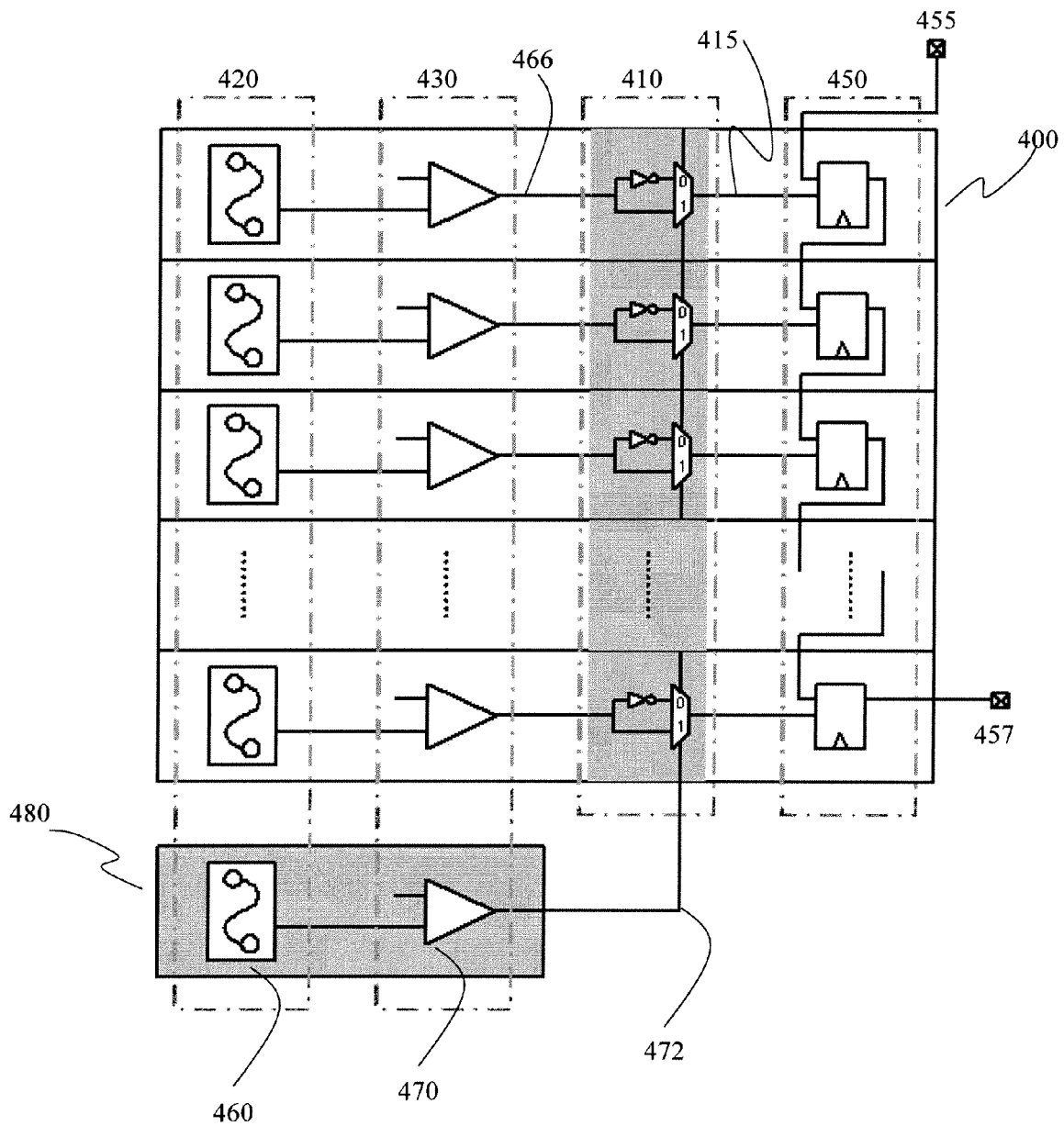
FIG. 4, meant to be illustrative and not restrictive, shows a simplified fuse frame with an embedded decoding logic block for decoding encoded fuse data used in an embodiment of the invention.

FIG. 4, in accordance with another embodiment of the present invention, shows a simplified fuse frame 400 with an embedded decoding logic block 410 for decoding encoded fuse data. One skilled in the art should appreciate that any number of fuse array frames may be used even though only one is shown in FIG. 4. One skilled in the art should also appreciate that any number of fuse slices may be used and the embodiments are not limited to any particular number of fuse slices. FIG. 4, meant to be illustrative and not limiting, shows the structure of a fuse frame 400 and the decoding logic block 410 within that frame 400. An array of fuses 420 is coupled to an array of sense amplifiers 430. In an example embodiment, the fuses 420 are poly fuses. However, this is meant to be exemplary and not limiting.

An array of logic circuits 410 is positioned between the sense amplifiers 430 and the registers 450. In one embodiment, as shown in FIG. 4, the logic circuits 410 are an array of 2-to-1 multiplexers where one of the inputs of each of the multiplexers is inverted. One skilled in the art should appreciate that similar logic circuits may be used. In another embodiment, an array of 2-input XOR gates can be used in place of the 2-to-1 multiplexers. The output 466 of each of the sense amplifiers is coupled to each of the logic circuits 410. The output of each of the logic circuits 415 is then coupled to an array of registers 450.

As mentioned earlier, the array of logic circuits 410 performs the necessary decoding function before the value is recorded in the registers 450. An individual fuse 460 is used to determine if an inversion is necessary in the decoding process. In an example embodiment, the fuse 460 is used as a flag bit to record the earlier encoding scheme. The individual fuse 460 is coupled to a sense amplifier 470. The output 472 of the sense amplifier 470 is coupled to an input to each of the logic circuits 410. In an example embodiment, the input to each of the logic circuits 410 is a select line of each of the 2-to-1 multiplexers. As shown in FIG. 4, the individual fuse 460, acting as a flag bit, controls the decoding logic 410.

In one embodiment, the fuse 460 is blown to indicate that no inversion is necessary. A blown fuse, in one embodiment, represents logic '1'. The output 472 of the sense amplifier 470 carries the value '1' when the fuse 460 is blown in an example embodiment. One skilled in the art should appreciate that the fuse 460 can remain unblown to represent logic '1' and the decoding logic circuits will have to decode accordingly based on the value carried by the flag bit i.e., fuse 460. The input line to the first register 455 may be coupled to a previous fuse frame, or if the frame is the first frame, then the input 455 is coupled to Vss Likewise, the output of the last register 457 is coupled to the next frame. If the frame is the last frame, then the output 457 is coupled to the destination. In an example embodiment, the destination is the JTAG (Joint Test Action Group) interface. However, this is meant to be exemplary and not limiting.

Figure 5:
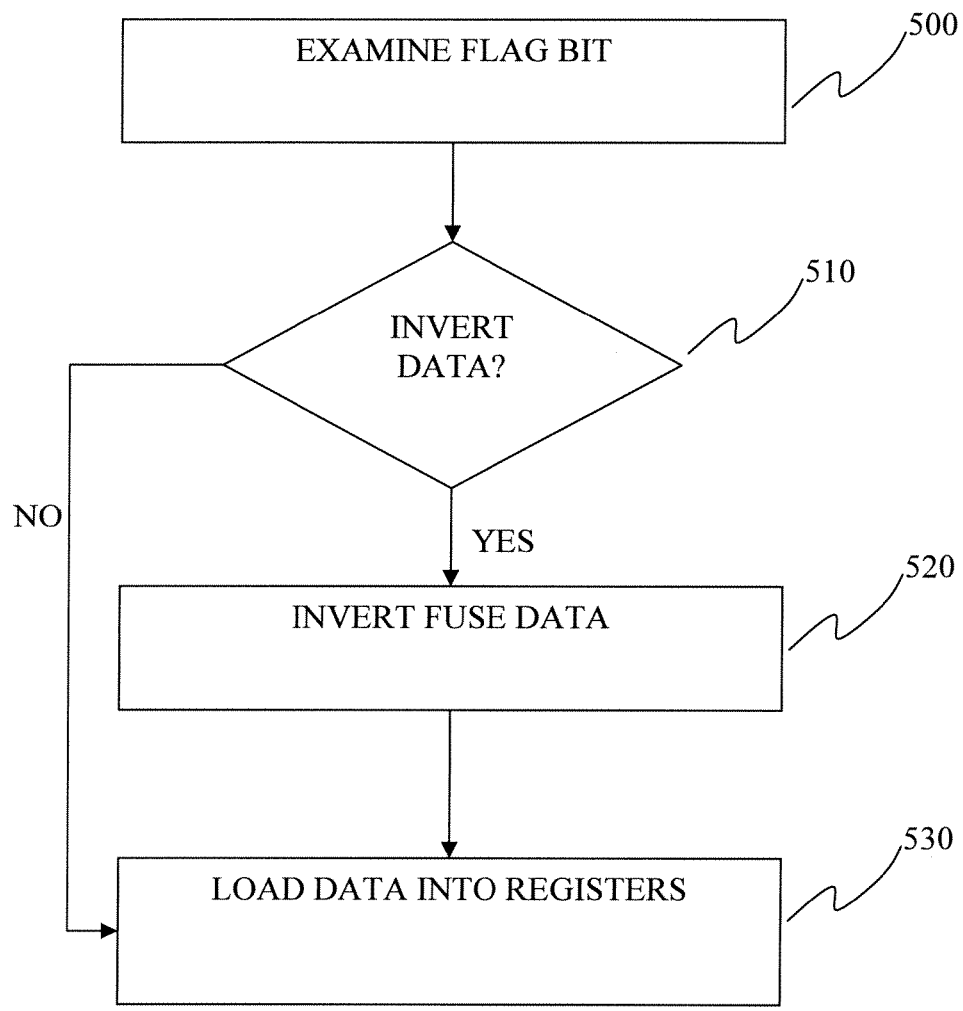
FIG. 5, in accordance with another embodiment of the present invention, shows the steps to decode encoded fuse data used in an embodiment of the invention.

FIG. 5, in accordance with another embodiment of the present invention, shows method operations to decode encoded fuse data. The flag bit is examined in operation 500. In one embodiment, a fuse is used as a flag bit. If the value of the flag bit is a "0" in operation 510, the data is inverted in operation 520. In an example embodiment where a fuse is used as a flag bit, an unblown fuse represents logic zero. However, this is meant to be exemplary and not limiting. One skilled in the art should appreciate that an unblown fuse can represent logic one if preferred. If the value of the flag bit is a "1", then the data is not inverted. In an example embodiment where a fuse is used as a flag bit, the fuse is blown to represent logic one. However, this is meant to be exemplary and not limiting. The data is loaded into registers in operation 530 after decoding.

Figure 6:
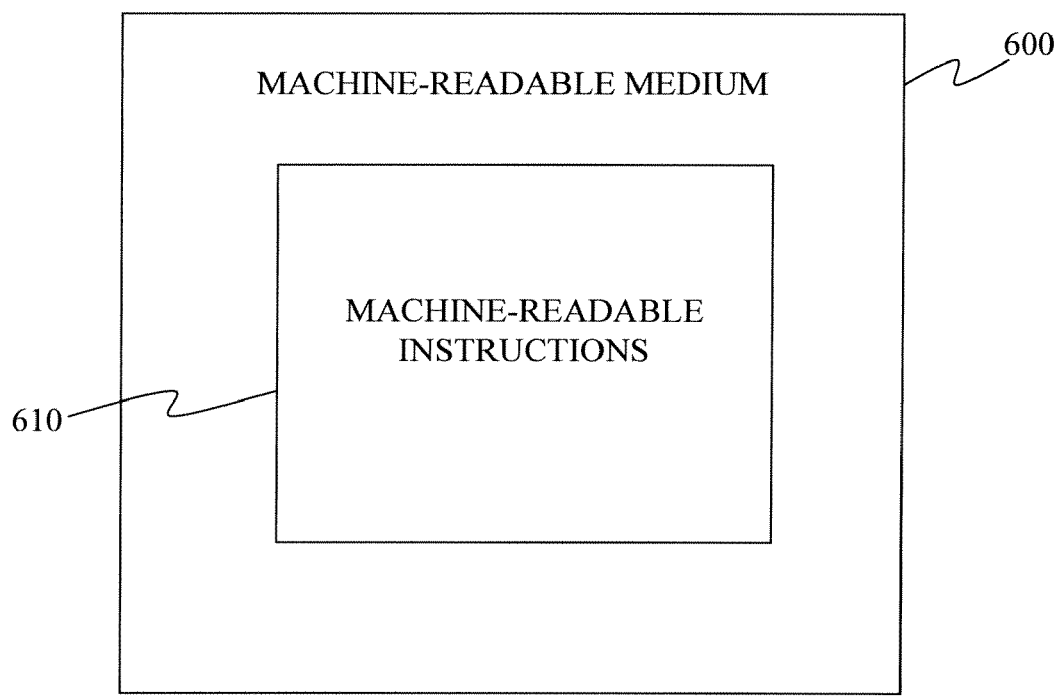
FIG. 6 is a simplified block diagram of a machine-readable medium in accordance with a possible aspect of the invention.

The invention can also be embodied as computer readable code on a computer readable medium as shown in FIG. 6. The computer readable medium 600 is any data storage device that can store data, which can thereafter be read by a computer system. Illustrative examples of the computer readable medium include hard drives, network attached storage (NAS), read-only memory, random-access memory, CDs, DVDs, USB drives, volatile and non-volatile memory, and other optical and non-optical data storage devices. The computer readable medium can also be distributed over a network-coupled computer system so that the computer readable instructions 610 is stored and executed in a distributed fashion. The computer readable instructions 610 can perform the steps illustrated by FIG. 7.

Figure 7:
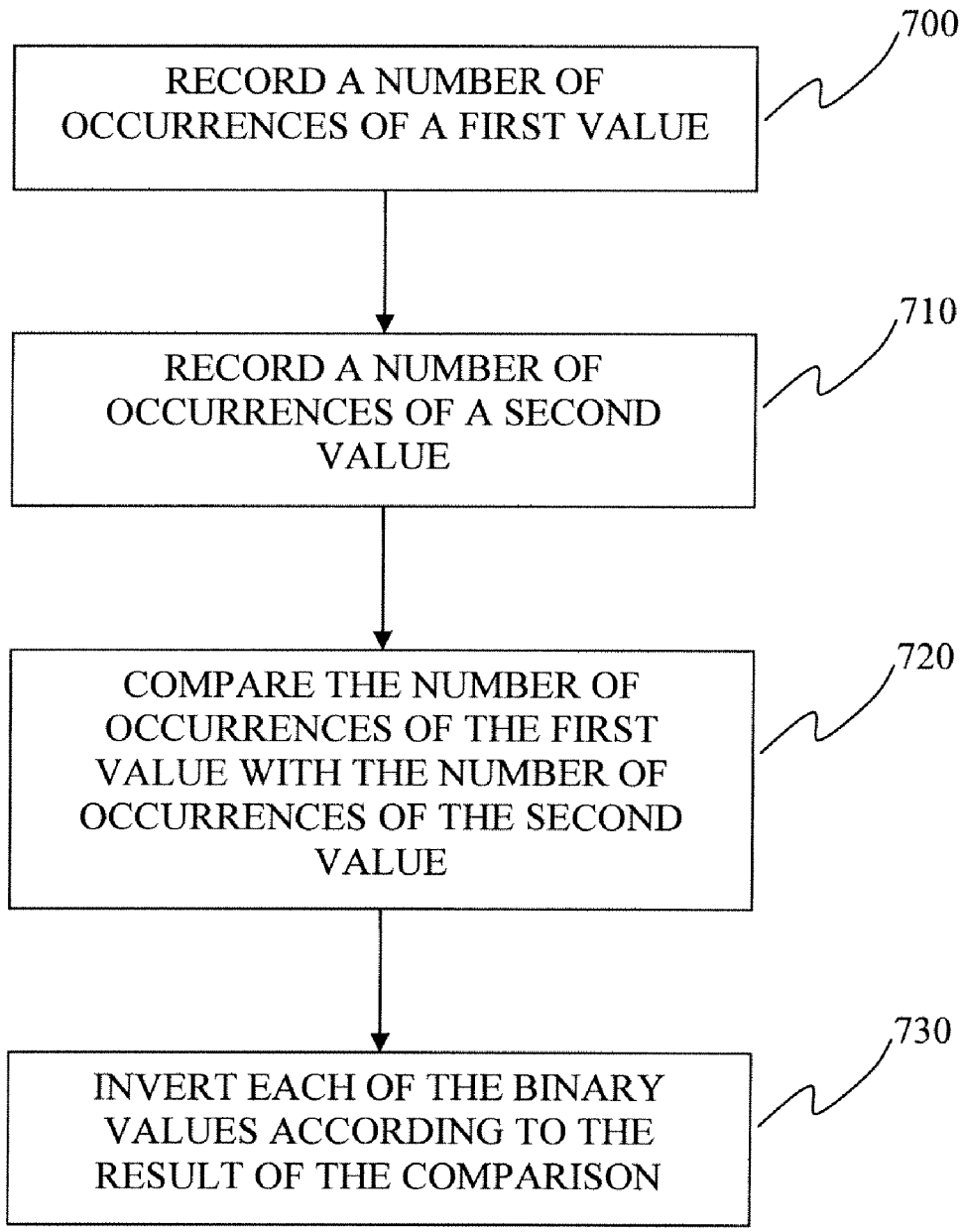
FIG. 7 is a simplified flow chart showing the method operations to encode fuse data used in an embodiment of the invention.

FIG. 7 is a simplified flow chart showing the steps to encode fuse data. The number of occurrences of a first value is recorded in operation 700. The number of occurrences of a second value is likewise recorded in operation 710. Then, the number of occurrences of the first value and the number of occurrences of the second value are compared in operation 720. Each of the binary values is inverted in operation 730 based on the result of the comparison in operation 720.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for decoding fuse data, comprising:
    an array of fuses;
    an array of amplifiers coupled to the array of fuses;
    an array of registers;
    an array of logic circuits positioned between the array of amplifiers and the array of registers, wherein a first input of each logic circuit in the array of logic circuits is coupled to each amplifier in the array of amplifiers and wherein an output of each logic circuit in the array of logic circuits is coupled to an input of each register in the array of registers; and
    a flag fuse coupled to an amplifier in the array of amplifiers, wherein output of the amplifier is coupled to a second input of the each logic circuit in the array of logic circuits.

2. The apparatus of claim 1, wherein the array of fuses is an array of poly fuses.

3. The apparatus of claim 1, wherein the logic circuits are one-bit 2-to-1 multiplexers.

4. The apparatus of claim 3, wherein an input to each of the multiplexers is inverted.

5. The apparatus of claim 1, wherein the logic circuits are 2-input XOR gates.

6. The apparatus of claim 1, wherein the flag fuse controls the output of each of the logic circuits.

7. A system to reduce fuse sense current, comprising:
    a first counter;
    a second counter, wherein an input to the second counter is inverted;
    a comparator, wherein an output of the first counter is coupled to a first input of the comparator and an output of the second counter is coupled to a second input of the comparator; and
    logic circuits, wherein a first input of each of the logic circuits is coupled to an output of the comparator, a second input of each of the logic circuits is coupled to each output of an array of registers, the logic circuits positioned between the array of registers and an array of fuses.

8. The system of claim 7, wherein the logic circuits invert the output from the array of registers according to the value of the output of the comparator.

9. The system of claim 7, wherein the logic circuits are an array of 2-to-1 multiplexers.

10. The system of claim 7, wherein the logic circuits are an array of 2-input XOR gates.

11. The system of claim 9, wherein a select signal for each of the 2-to-1 multiplexers is generated by a fuse.

12. The system of claim 7, wherein output of the logic circuits is based on a fuse setting.

13. An apparatus for decoding fuse data, comprising:
    an array of fuses;
    an array of amplifiers coupled to the array of fuses;
    an array of registers;
    an array of logic circuits positioned between the array of amplifiers and the array of registers, wherein a first input of each logic circuit in the array of logic circuits is coupled to each amplifier in the array of amplifiers and wherein an output of each logic circuit in the array of logic circuits is coupled to an input of each register in the array of registers; and
    a fuse coupled to an amplifier in the array of amplifiers, wherein output of the amplifier determines the output of each logic circuit.

14. The apparatus of claim 13, wherein the array of fuses is an array of poly fuses.

15. The apparatus of claim 13, wherein the logic circuits are one-bit 2-to-1 multiplexers.

16. The apparatus of claim 15, wherein an input to each of the multiplexers is inverted.

17. The apparatus of claim 13, wherein the logic circuits are 2-input XOR gates.

* * * * *